US012288737B2

(12) United States Patent
Ho et al.

(10) Patent No.: US 12,288,737 B2
(45) Date of Patent: Apr. 29, 2025

(54) THIN SEMICONDUCTOR PACKAGING UNIT HAVING A PLURALITY OF BRIDGING LAYERS

(71) Applicant: PANJIT INTERNATIONAL INC., Kaohsiung (TW)

(72) Inventors: Chung-Hsiung Ho, Kaohsiung (TW); Chi-Hsueh Li, Tainan (TW)

(73) Assignee: PANJIT INTERNATIONAL INC., Kaohsiung (TW)

( * ) Notice: Subject to any disclaimer, the term of this patent is extended or adjusted under 35 U.S.C. 154(b) by 555 days.

(21) Appl. No.: 17/857,760

(22) Filed: Jul. 5, 2022

(65) Prior Publication Data

US 2023/0395469 A1 Dec. 7, 2023

(30) Foreign Application Priority Data

Jun. 7, 2022 (TW) .................................. 111121059

(51) Int. Cl.
| | |
|---|---|
| *H01L 23/495* | (2006.01) |
| *H01L 21/56* | (2006.01) |
| *H01L 23/00* | (2006.01) |
| *H01L 23/31* | (2006.01) |

(52) U.S. Cl.
CPC ........ *H01L 23/49541* (2013.01); *H01L 21/56* (2013.01); *H01L 23/3107* (2013.01); *H01L 23/3185* (2013.01); *H01L 23/49524* (2013.01); *H01L 24/40* (2013.01); *H01L 24/41* (2013.01); *H01L 2224/40175* (2013.01); *H01L 2924/181* (2013.01)

(58) Field of Classification Search
CPC .......... H01L 23/49541; H01L 23/3185; H01L 23/3107; H01L 24/40; H01L 24/41; H01L 23/49524; H01L 2224/40175; H01L 2924/181
See application file for complete search history.

(56) References Cited

U.S. PATENT DOCUMENTS

| | | | |
|---|---|---|---|
| 8,680,658 B2 * | 3/2014 | Shi ......................... | H01L 24/73 257/E23.047 |
| 8,987,879 B2 * | 3/2015 | Otremba ........... | H01L 23/49524 257/676 |
| 10,153,248 B2 * | 12/2018 | Chinnusamy ....... | H01L 23/3107 |
| 11,088,046 B2 * | 8/2021 | Estacio ............. | H01L 23/49575 |

(Continued)

*Primary Examiner* — Alonzo Chambliss
(74) *Attorney, Agent, or Firm* — Birch, Stewart, Kolasch & Birch, LLP (57) ABSTRACT

A thin semiconductor packaging unit includes a semiconductor die, a mold, two contact bulks, a first bridge layer, a second bride layer, and two insulation layers; the mold covers a side surface of the semiconductor die; the mold includes two sides, and each of the sides includes at least one first contact area; the two contact bulks are respectively mounted on the two sides of the mold; each of the contact bulks includes at least one second contact area connecting the at least one first contact area; the first bridge layer connects the top electrode of the semiconductor die to one of the contact bulks; the second bride layer connects the bottom electrode of the semiconductor die to the other one of the contact bulks; the two insulation layers respectively cover the first bridge layer and the second bridge layer; the present invention dissipates heat efficiently.

16 Claims, 10 Drawing Sheets

(56) References Cited

U.S. PATENT DOCUMENTS

2011/0133337 A1* 6/2011 Shau ............... H01L 21/561
                                              257/E23.012
2012/0146202 A1* 6/2012 Xue ............... H01L 23/3107
                                              257/676

* cited by examiner

THIN SEMICONDUCTOR PACKAGING UNIT HAVING A PLURALITY OF BRIDGING LAYERS

CROSS-REFERENCE TO RELATED APPLICATION(S)

This application claims the priority benefit of TW application serial No. 111121059 filed on Jun. 7, 2022, the entirety of which is hereby incorporated by reference herein and made a part of the specification.

BACKGROUND OF THE INVENTION

1. Field of the Invention

The present invention relates to a semiconductor packaging unit, more particularly a thin semiconductor packaging unit.

2. Description of the Related Art

A conventional packaging method for a conventional semiconductor packaging unit includes the following steps.

Figure 13:
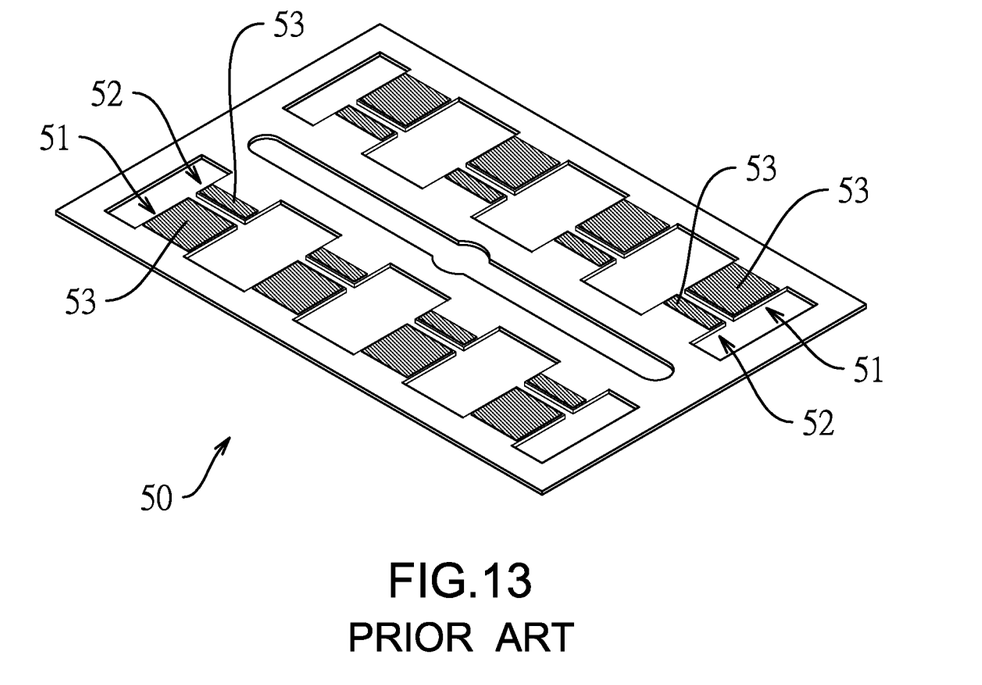
FIG. 13 is a perspective view of a conventional packaging method of printing a tin paste layer on a lead frame.

With reference to FIG. 13, preparing a lead frame 50, wherein the lead frame 50 includes multiple first contacts 51 and multiple second contacts 52. Each of the first contacts 51 faces one of the second contacts 52. A gap is formed between each of the first contacts 51 and one of the second contacts 52. Tin paste layers 53 are respectively printed on top surfaces of the first contacts 51 and top surfaces of the second contacts 52.

Figure 14:
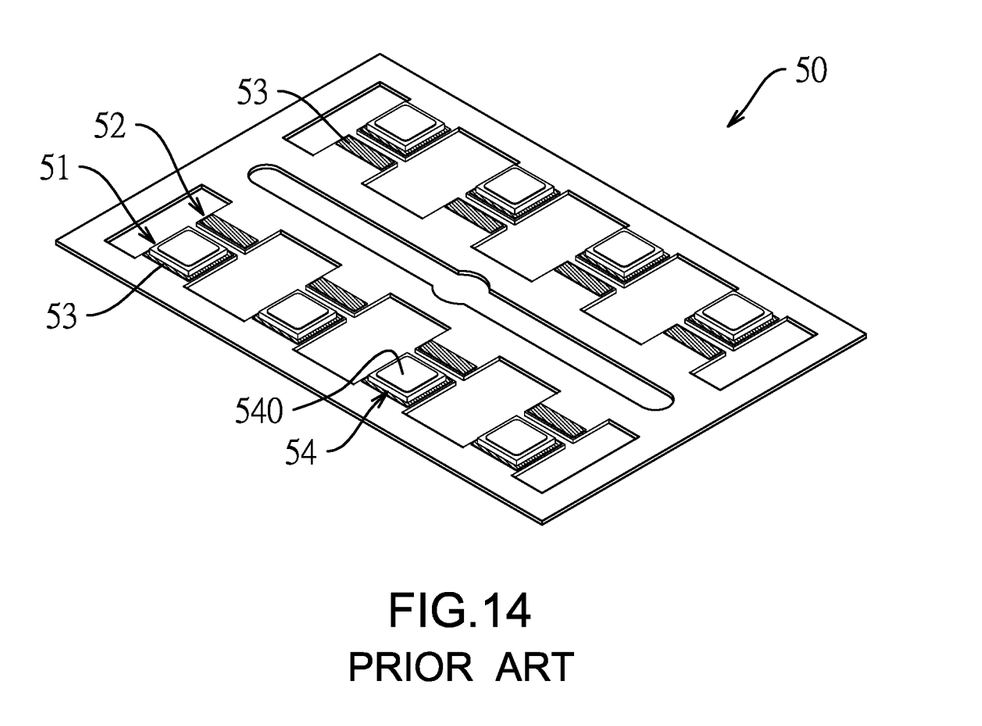
FIG. 14 is a perspective view of the conventional packaging method of mounting semiconductor dies on the tin paste layer.

With reference to FIG. 14, respectively mount multiple semiconductor dies on the tin paste layer 53 of the first contacts 51. Bottom electrodes (omitted in figures) of the semiconductor dies 54 are mounted on the tin paste layers 53 of the first contacts 51, and top electrodes 540 of the semiconductor dies 54 are facing upward. For example, the semiconductor dies 54 are diode dies, and the top electrodes 540 and the bottom electrodes of the diode dies have different polarities.

Figure 15:
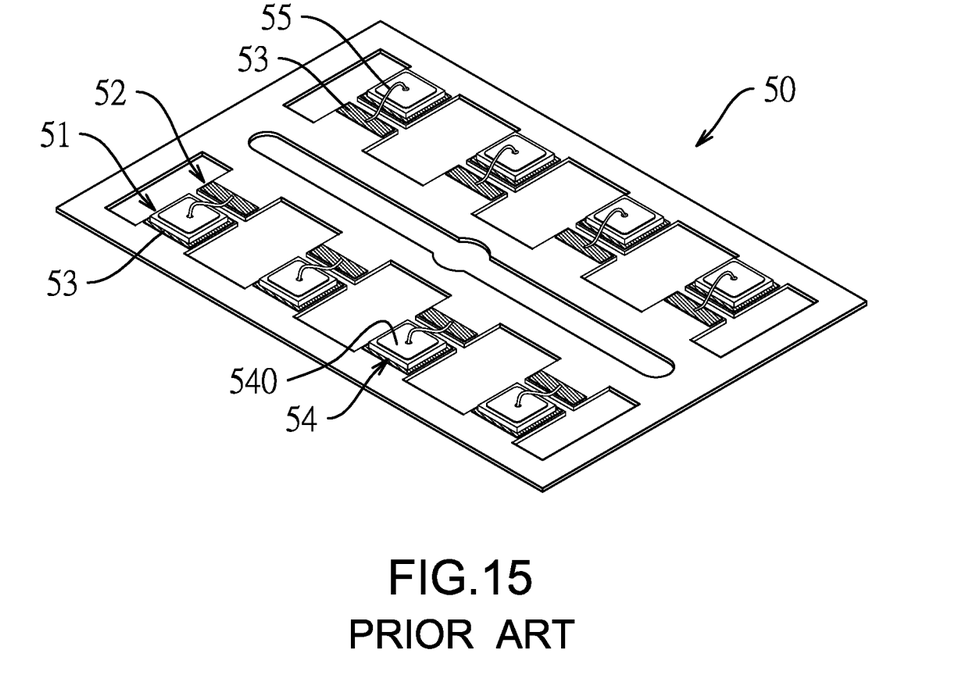
FIG. 15 is a perspective view of the conventional packaging method of installing a conductive wire through wire bonding.

With reference to FIG. 15, through wire bonding, respectively connect the top electrodes 540 of the semiconductor dies 54 to the tin paste layers 53 of the respective second contacts 52 with conductive wires 55.

Figure 16:
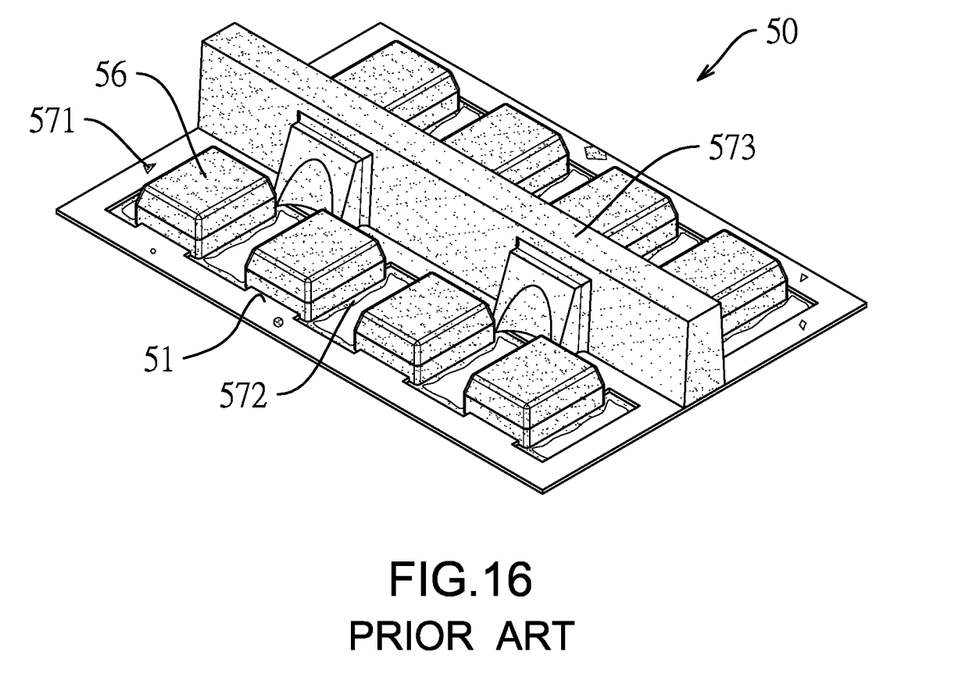
FIG. 16 is a perspective view of the conventional packaging method of molding.

With reference to FIG. 16, processing a molding by filling multiple molds 56 respectively on the semiconductor dies 54, the first contacts 51, and the second contacts 52. The molds 56 respectively cover the semiconductor dies 54, the first contacts 51, the second contacts 52, and the conductive wire 55. More particularly, the semiconductor dies 54 and the conductive wire 55 are fully covered by the molds 56. The lead frame 50 further includes a residue 571, multiple burrs 572, and a frame 573 corresponding to a runner of a respective molding equipment.

Figure 17:
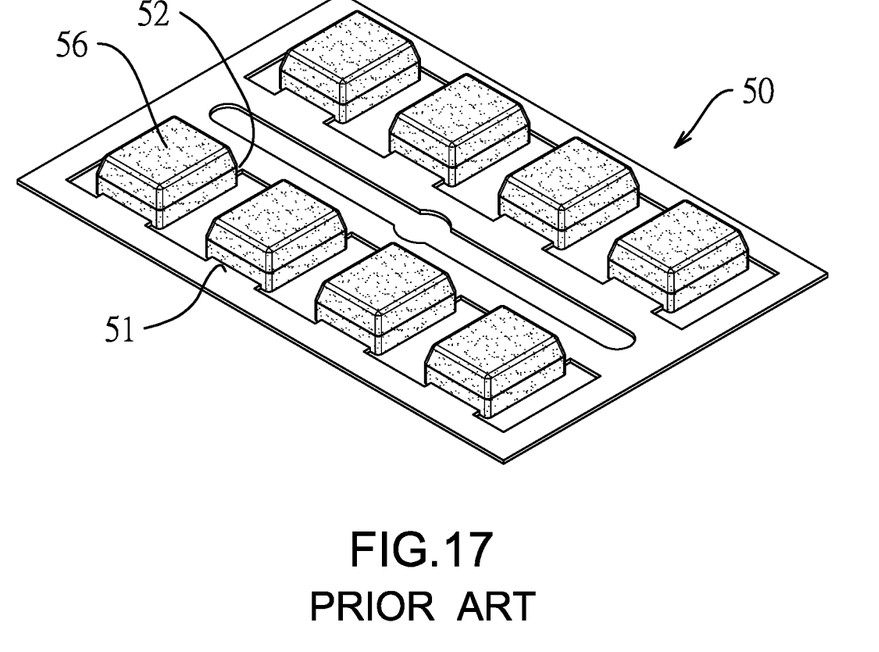
FIG. 17 is a perspective view of the conventional packaging method of removing a frame, a residue, and burrs produced by molding.

With reference to FIG. 17, remove the frame 573, the residue 571, and the burrs 572.

Figure 18:
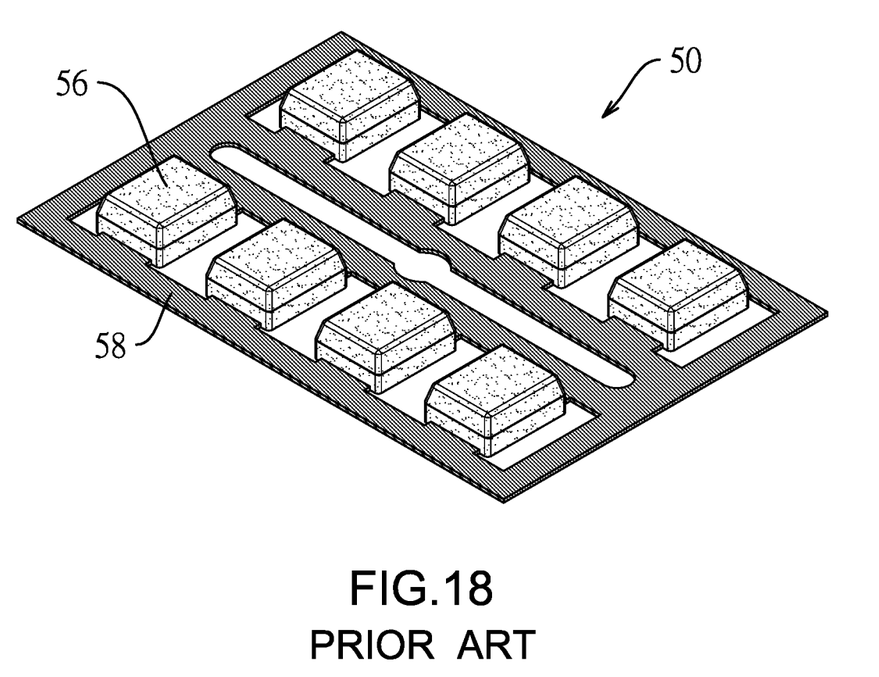
FIG. 18 is a perspective view of the conventional packaging method of forming a conductive layer on the lead frame.

With reference to FIG. 18, form a conductive layer 58 by electroplating on the lead frame 50. In other words, parts of the lead frame 50 exposed outside of the molds 56, including the first contacts 51 and the second contacts 52, are covered by the conductive layer 58.

Figure 19:
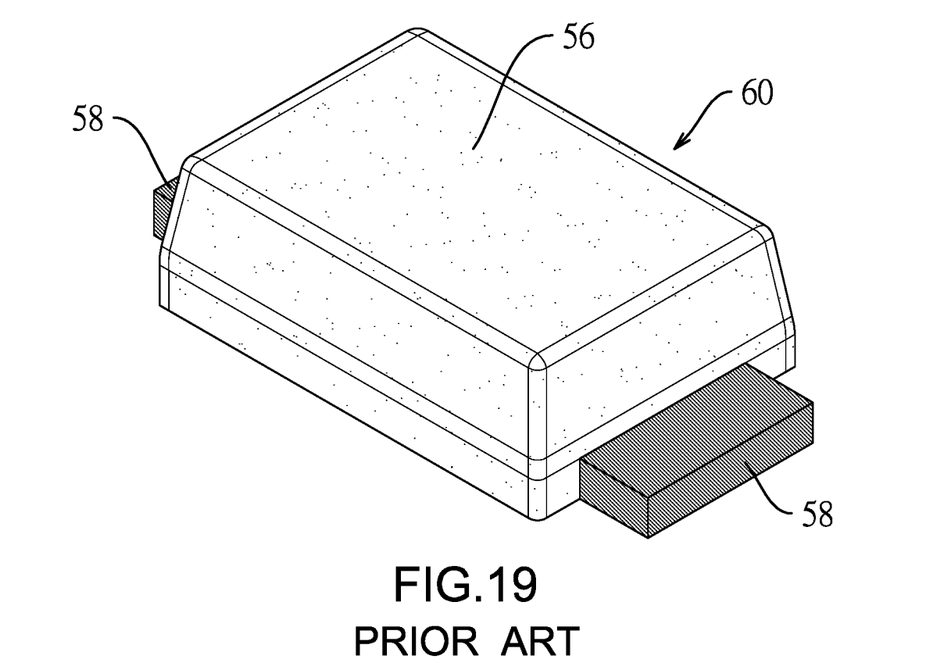
FIG. 19 is a three dimensional external perspective view of a conventional semiconductor packaging unit.

With reference to FIG. 19, further dice the lead frame 50 for separating the molds 56, and thus complete manufacturing the conventional semiconductor packaging unit 60 as shown in FIG. 19.

Figure 20:
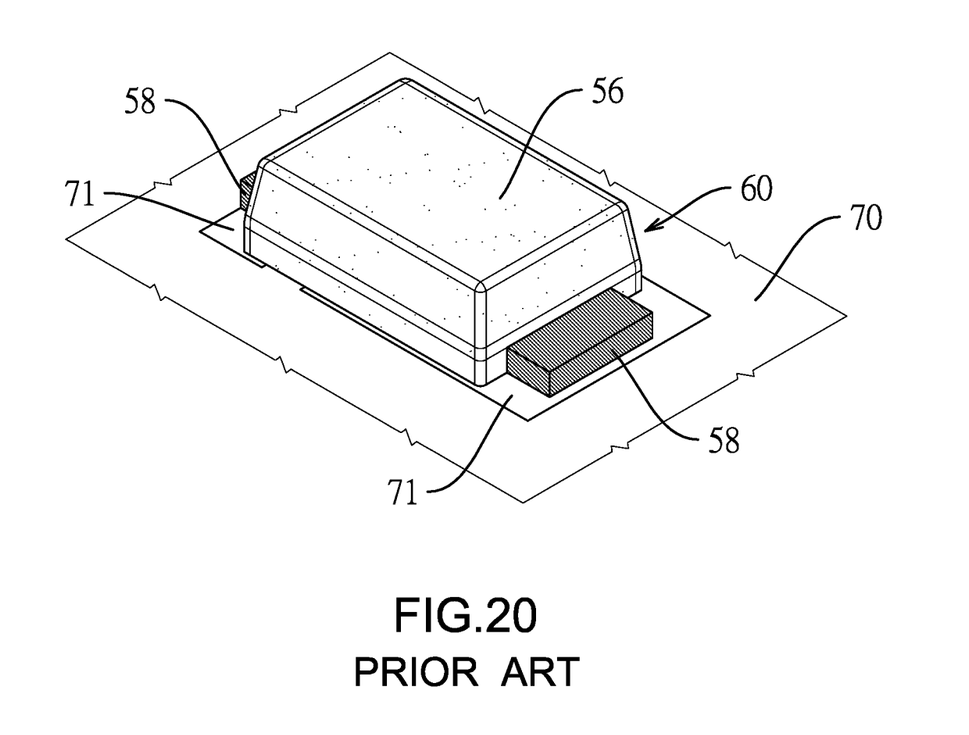
FIG. 20 is a perspective view of mounting the conventional semiconductor packaging unit on a printed circuit board.

With reference to FIG. 20, FIG. 20 shows a structure of the conventional semiconductor packaging unit 60 mounted on a conventional printed circuit board (PCB) 70. The conductive layer 58 of the conventional semiconductor packaging unit 60 respectively connects two different contacts 71 of the conventional PCB 70.

However, the molds 56 of the conventional semiconductor packaging unit 60 require a standard amount of thickness and volume for fully covering the semiconductor dies 54 and the conductive wire 55. When the conventional semiconductor packaging unit 60 is in use in a circuit, heat generated by the semiconductor dies 54 is ineffectively dissipated through the molds 56. This limits an overall efficiency of heat dissipation of the conventional semiconductor packaging unit 60.

Furthermore, the molds 56 of the conventional semiconductor packaging unit 60 are formed by mold filling in the conventional packaging method. Therefore, the frame 573, the residue 571, and the burrs 572 are naturally produced on the lead frame 50 as shown in FIG. 16. As a result, additional work is required for removing the frame 573, the residue 571, and the burrs 572. This makes simplifying the conventional packaging method harder.

SUMMARY OF THE INVENTION

To overcome the aforementioned problems, the present invention provides a thin semiconductor packaging unit. The present invention is able to more efficiently dissipate heat in comparison to the said conventional semiconductor packaging unit in the prior arts.

The thin semiconductor packaging unit of the present invention includes:
- a semiconductor die, having a top electrode and a bottom electrode;
- a mold, covering a side surface of the semiconductor die, and exposing the top electrode and the bottom electrode; wherein the mold includes two sides, and each of the sides includes at least one first contact area;
- two contact bulks, respectively mounted on the two sides of the mold; wherein each of the contact bulks includes at least one second contact area, and the at least one second contact area is connected with the at least one first contact area;
- a first bridge layer, connecting the top electrode of the semiconductor die to one of the contact bulks;
- a second bride layer, connecting the bottom electrode of the semiconductor die to the other one of the contact bulks; and
- two insulation layers, respectively covering the first bridge layer and the second bridge layer.

Different from the prior arts, a structure of a semiconductor die in the present invention avoids connecting contacts of a lead frame with a conductive wire, and also avoids requiring a mold with larger volume and thicker thickness for manufacturing a semiconductor packaging unit. The present invention has each of the semiconductor dies respectively connecting to the two contact bulks through the first bridge layer and the second bridge layer. The present invention also further covers the first bridge layer and the second bridge layer with the two insulation layers for protection. Since the first bridge layer, the second bridge layer, and the two insulation layers are all thin layers, the semiconductor packaging unit of the present invention is overall thinner and smaller than the said conventional semiconductor packaging unit. When the semiconductor packaging unit of the present invention is in use, heat generated by the semiconductor die in the present invention dissipates faster through heat conduction to surfaces of the insulation layers in comparison to the prior arts. The present invention therefore dissipates heat more efficiently in comparison to the prior arts.

DETAILED DESCRIPTION OF THE INVENTION

Figure 1:
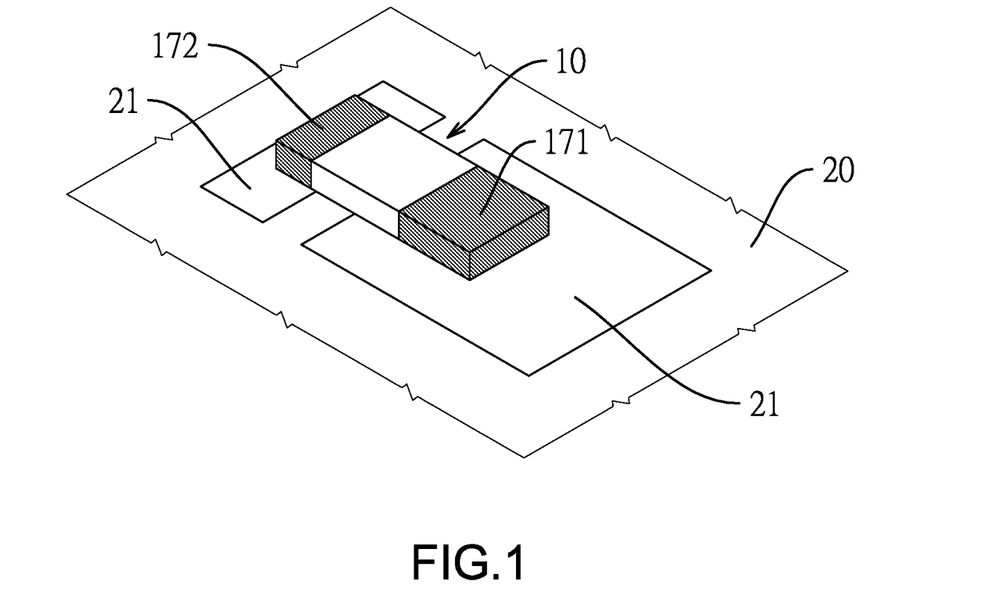
FIG. 1 is a perspective view of an embodiment of a semiconductor packaging unit of the present invention mounted on a printed circuit board.

With reference to FIG. 1, a semiconductor packaging unit 10 of the present invention is mounted on a printed circuit board (PCB) 20. In comparison to a conventional semiconductor packaging unit 60 shown in FIGS. 19 and 20, the semiconductor packaging unit 10 of the present invention has less thickness and volume, in other words thinner and smaller, than the conventional semiconductor packaging unit 60. Further, since the semiconductor packaging unit 10 of the present invention has an external appearance of a passive component such as a resistor, an inductor, or a capacitor, the semiconductor packaging unit 10 of the present invention is more easily applicable to surface-mounted technology (SMT) than the conventional semiconductor packaging unit 60.

The following figures show a packaging method for the semiconductor packaging unit 10 and structures of the semiconductor packaging unit 10. The packaging method includes a die bonding step, a molding step, a grinding step, a tracing step, a solder masking step, a singulation step, and/or additionally a surface-processing step.

Figure 2:
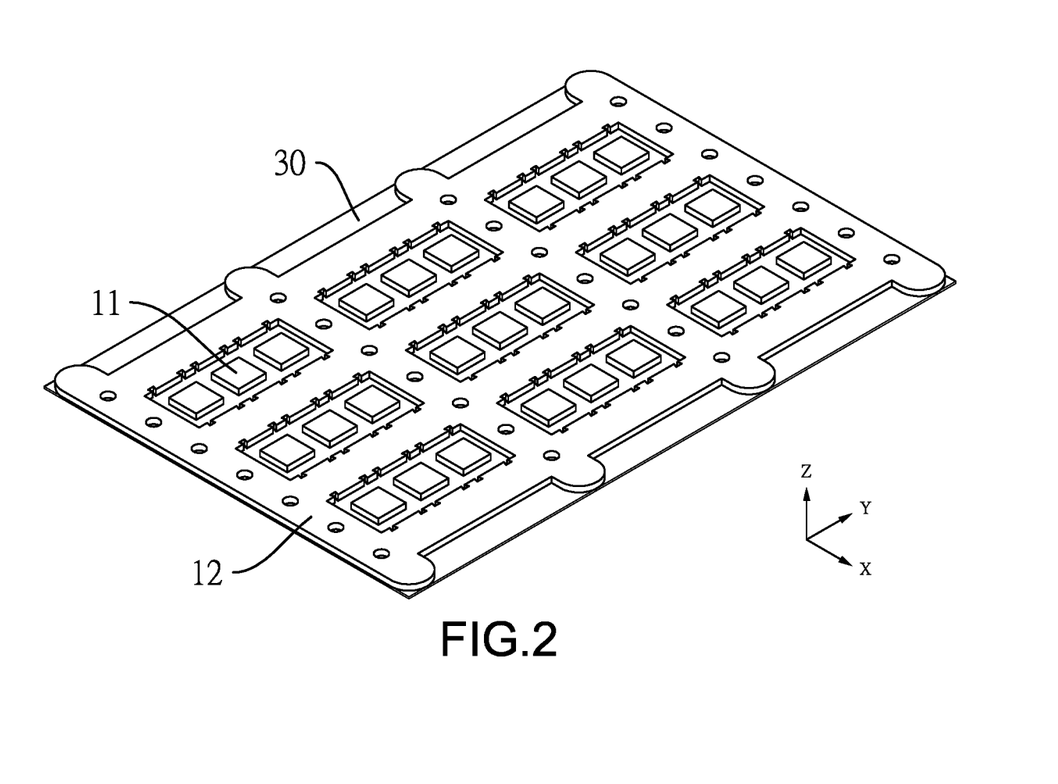
FIG. 2 is a perspective view of a die bonding step of a packaging method of the present invention.
Figure 3:
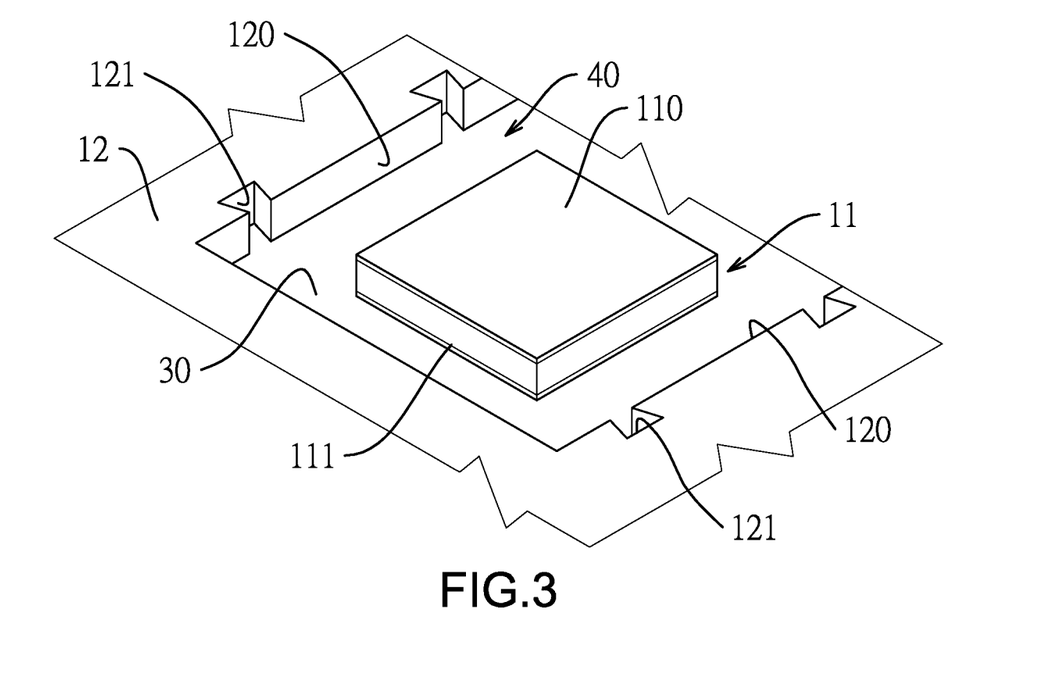
FIG. 3 is a partially enlarged perspective view of FIG. 2.

1. The Die Bonding Step:

With reference to FIGS. 2 and 3, mount multiple semiconductor dies 11 on a lead frame 12 at intervals, wherein a gap space is formed between the lead frame 12 and each of the semiconductor dies 11, and the lead frame 12 is conductive. The semiconductor dies 11 are diced from a wafer, and each of the semiconductor dies 11 is a semiconductor component with a function. As an example, the lead frame 12 is a copper frame, and the semiconductor dies 11 are diode dies. Each of the semiconductor dies 11 has a top electrode 110 and a bottom electrode 111 with different polarities. For instance, the top electrode 110 is an anode, and the bottom electrode 111 is a cathode. However, the semiconductor dies 11 are free to be elsewise than diode dies in other embodiments of the present invention. In an embodiment of the present invention, the semiconductor dies 11 and the lead frame 12 are mounted on a surface of a film 30. The surface of the film is flat, and in the present embodiment, the bottom electrodes 111 of the semiconductor dies 11 are mounted on the surface of the film 30. The semiconductor dies 11 and the lead frame 12 can either have same thickness or different thickness. A gap space 40 is formed between the lead frame 12 and each of the semiconductor dies 11. The film 30 is exposed through the gap space 40. An area between any two of the adjacent semiconductor dies 11 is used for dicing.

For each of the semiconductor dies 11, the lead frame 12 includes two side surfaces 120 in the gap space 40 and horizontally along the gap space 40 (along an X-axis direction). The two side surfaces 120 of the lead frame 12 respectively face two opposite side surfaces of one of the semiconductor dies 11. Each of the two side surfaces 120 of the lead frame 12 includes at least one first contact area 121. In this embodiment, each of the two side surfaces 120 of the lead frame 12 includes two first contact areas 121, and each of the first contact areas 121 is conically-shaped as a groove, in other words each of the first contact areas 121 is shaped as a dovetail groove, wherein a width of the groove gradually decreases in a direction towards each of the semiconductor dies 11, and the groove communicates with the gap space 40. Please note that the groove is shaped elsewise in other embodiments, for instance the groove can be rectangular, or barbed, etc.

Figure 4:
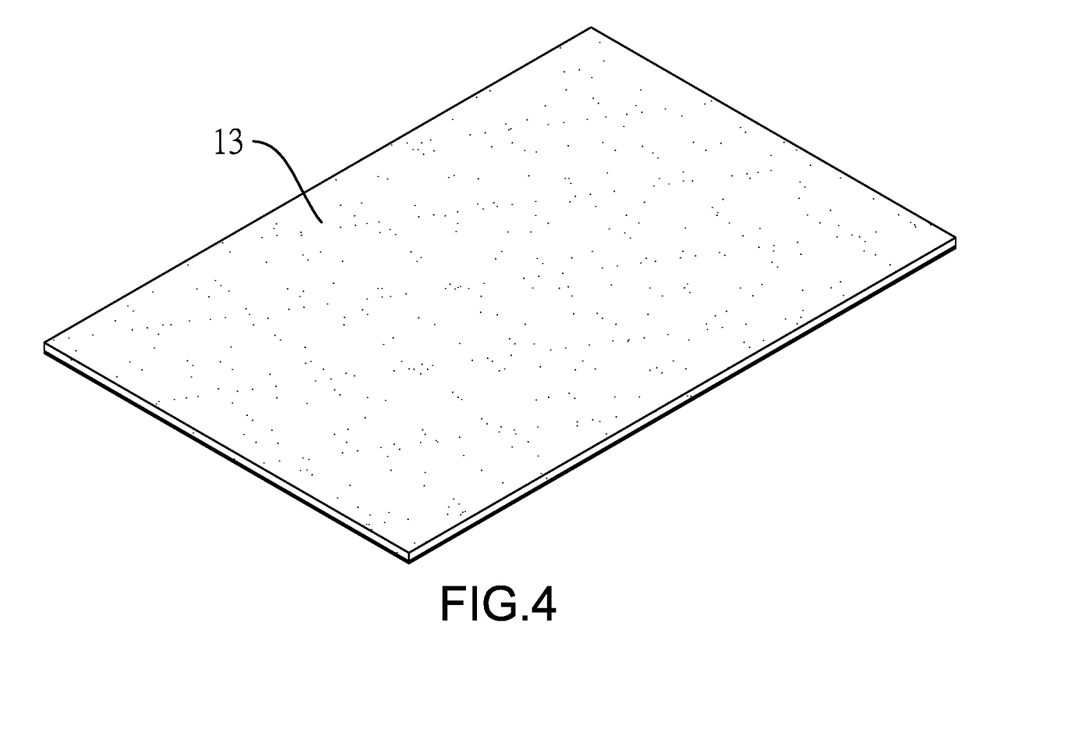
FIG. 4 is a perspective view of a molding step of the packaging method of the present invention.

2. The Molding Step:

With reference to FIG. 4, mount a molding layer 13. The molding layer 13 covers the lead frame 12 and the semiconductor dies 11 shown in FIG. 2, and the molding layer 13 fills in the gap space 40 shown in FIG. 3. Since each of the first contact areas 121 is the groove communicating with the gap space 40, the molding layer 13 also fills in each of the first contact areas 121. The molding layer 13 is a component made of dielectric materials.

Figure 5:
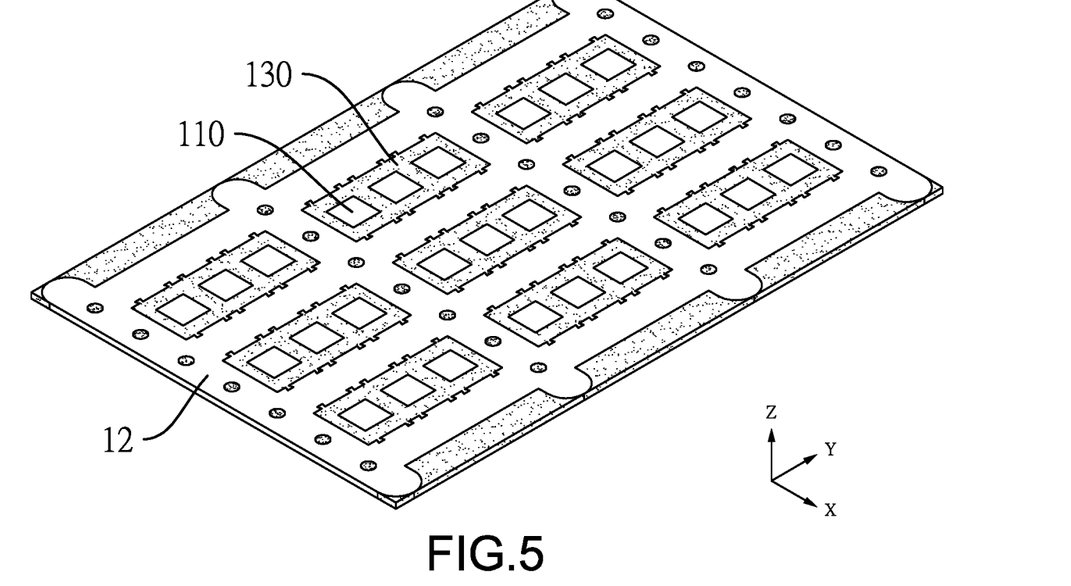
FIG. 5 is a perspective view of a grinding step of the packaging method of the present invention.

3. The Grinding Step:

With reference to FIG. 5, grind a surface of the molding layer 13 with a grinding machine. More particularly, by grinding the surface of the molding layer 13 facing away from the film 30, a thickness of the molding layer 13 is thinned down gradually until the lead frame 12 and the top electrode 110 of each of the semiconductor dies 11 are exposed as shown in FIG. 5. Molds 130 are formed from remaining parts of the molding layer 13 in the gap space 40 and the first contact areas 121 (the grooves) for each of the semiconductor dies 11. After the grinding step, a top surface of the lead frame 12, a top surface of each of the molds 130, and a surface of the top electrode 110 of each of the semiconductor dies 11 would be equally flat.

Figure 6:
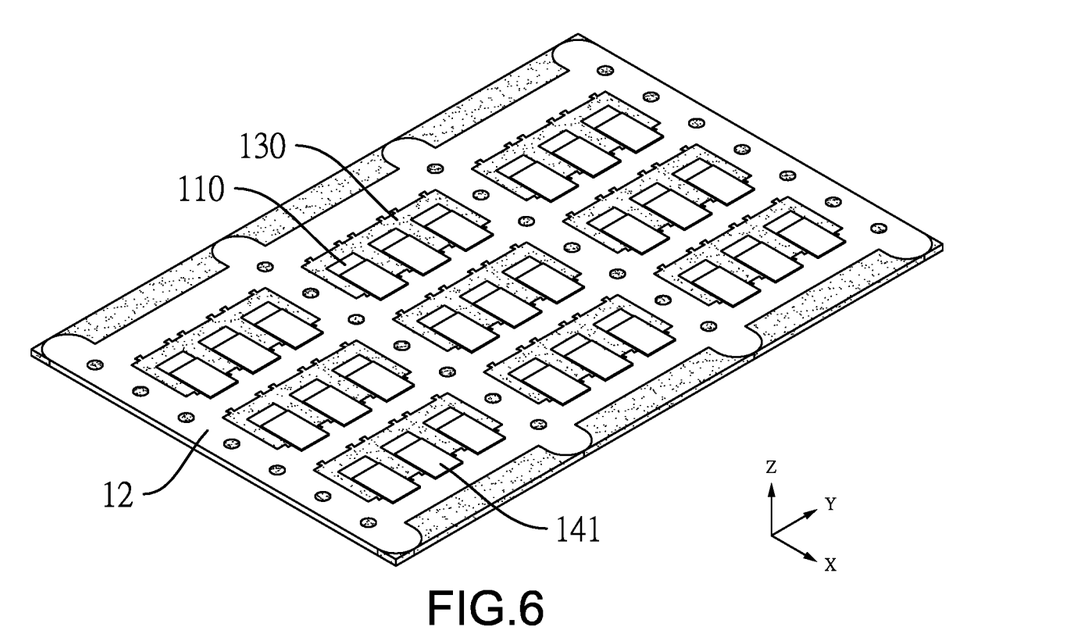
FIG. 6 is a perspective view of a tracing step of the packaging method of the present invention.

4. The Tracing Step:

With reference FIG. 6, mount a first bridge layer 141 for each of the semiconductor dies 11. Each of the first bridge layers 141 connects the top electrode 110 of each of the semiconductor dies 11 to the lead frame 12. More particularly, each of the first bridge layers 141 connects the surface of the top electrode 110 of each of the semiconductor dies 11, the top surface of each of the molds 130, and the top surface of the lead frame 12. As such, the top electrode 110 of each of the semiconductor dies 11 is able to electrically connect the lead frame 12 through the first bridge layer 141.

Furthermore, the present invention also includes mounting a second bridge layer (omitted in figures for reasons explained in later parts) for each of the semiconductor dies 11. By eliminating the film 30 shown in FIG. 2 for exposing a bottom surface of the lead frame 12, the bottom electrode 111 of each of the semiconductor dies 11, and a bottom surface of each of the molds 130, the appearance shown in FIG. 5 is achieved. The appearance shown in FIG. 5 is achieved by, for ease of understanding, flipping 180 degrees with respect to a Y-axis in FIG. 2. After removal of the film 30, the bottom surface of the lead frame 12, the bottom surface of each of the molds 130, and the bottom electrode 111 of each of the semiconductor dies 11 would be equally flat. As such, further mount the second bridge layer for connecting the bottom electrode 111 of each of the semiconductor dies 11 to the lead frame 12. For ease of understanding, in this case, once flipping 180 degrees with respect to the Y-axis in FIG. 2, an appearance shown in FIG. 6 is achieved. As such, the bottom electrode 111 of each of the semiconductor dies 11 is electrically connected to the lead frame 12. For each of the semiconductor dies 11, a part of the first bridge layer 141 connecting to the lead frame 12, horizontally along the X-axis, is in an opposite direction from a part of the second bridge layer connecting to the lead frame 12.

In an embodiment of the present invention, the first bridge layer 141 and the second bridge layer are formed by pattern plating, tenting, or printing.

Figure 7:
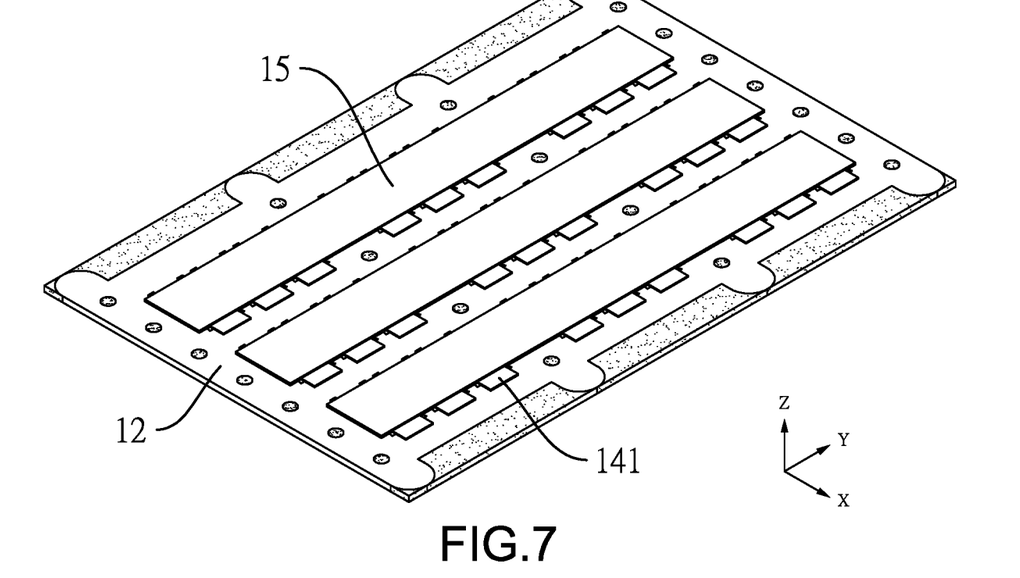
FIG. 7 is a perspective view of a solder masking step of the packaging method of the present invention.

5. The Solder Masking Step:

With reference to FIG. 7, respectively cover the first bridge layer 141 and the second bridge layer with two insulation layers 15. In the present embodiment, the two insulation layers 15 are ink layers, and the two insulation layers 15 are mounted to cover an overlapping part of the top electrode 110 of each of the semiconductor dies 11 and the first bridge layer 141 on each of the molds 130 with printing. Overlapping parts of the first bridge layer 141 and of the second bridge layer on the lead frame 12 are respectively exposed from the two insulation layers 15.

Figure 8:
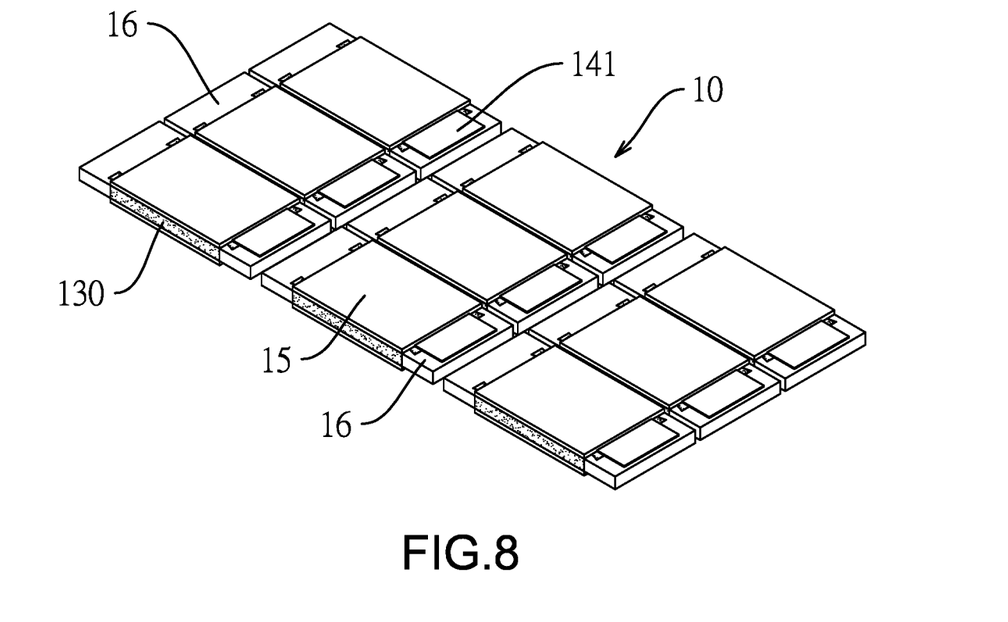
FIG. 8 is a perspective view of a singulation step of the packaging method of the present invention.
Figure 9:
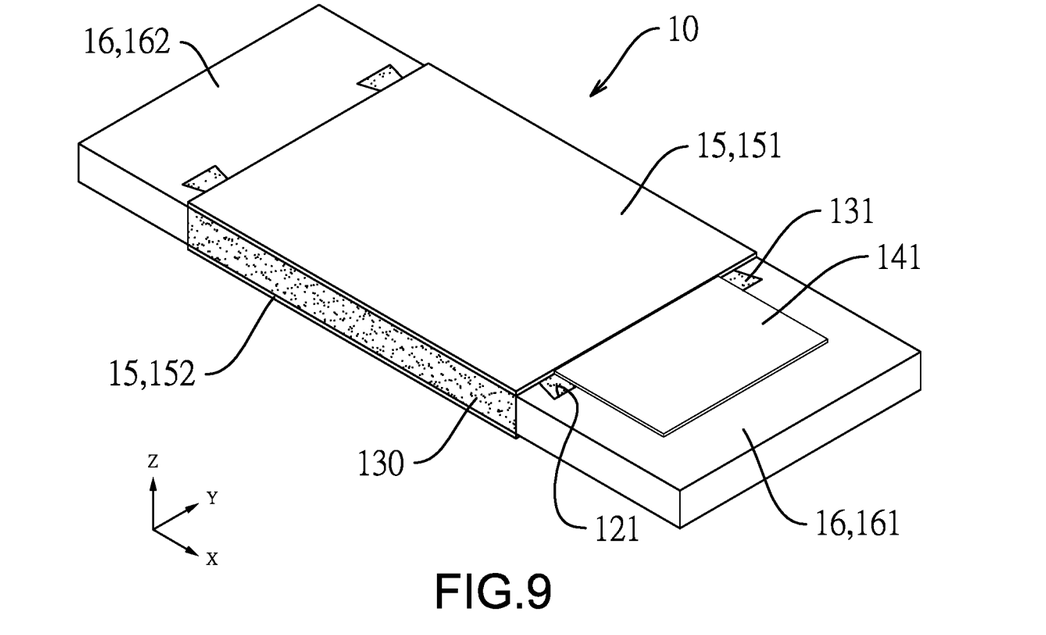
FIG. 9 is a three dimensional external perspective view of an embodiment of the semiconductor packaging unit of the present invention.

6. The Singulation Step:

With reference to FIGS. 8 and 9, dice the lead frame 12 according to locations of the semiconductor dies 11 to form multiple semiconductor packaging units 10 as shown in FIGS. 8 and 9. The lead frame 12 is diced by a laser beam or a blade. FIG. 8 shows only a few of the multiple semiconductor packaging units 10. Parts diced from the lead frame 12 shown in FIG. 7 form two contact bulks 16 for each of the semiconductor packaging units 10.

Figure 10:
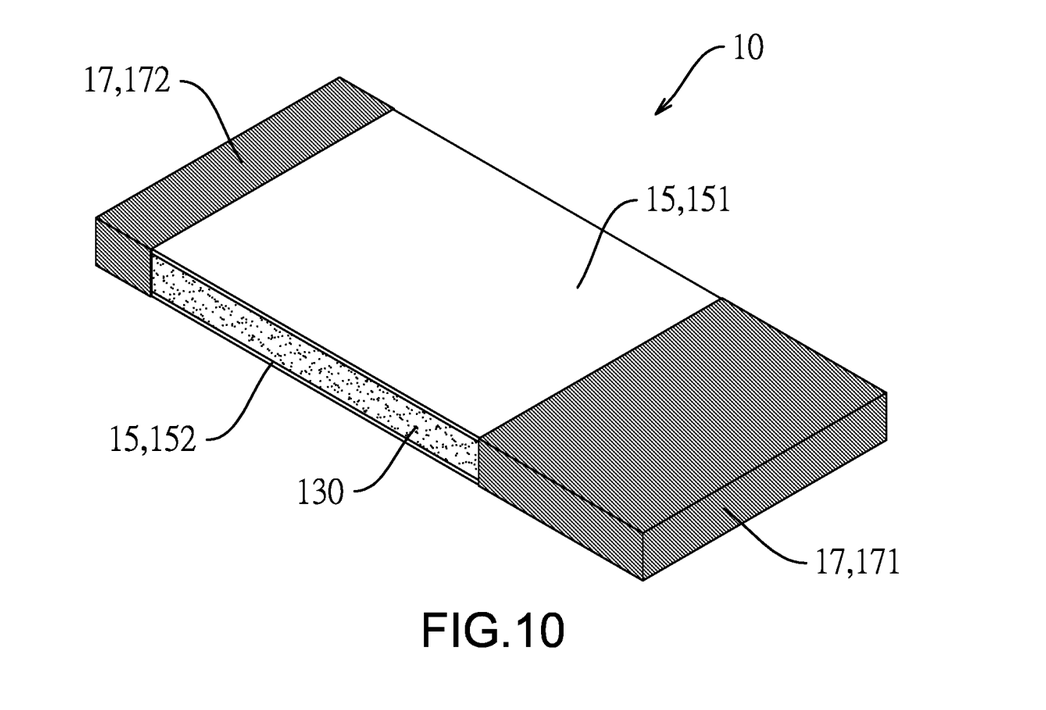
FIG. 10 is a three dimensional external perspective view of another embodiment of the semiconductor packaging unit of the present invention.

With reference to FIG. 10, the present embodiment additionally includes the surface-processing step. The surface-processing step uses methods such as organic solderability preservative (OSP), electroless plating, electroless Sn (tin) plating, electroless nickel immersion gold (ENIG), sputtering, and hot air solder leveling (HASL). However, the surface-processing step is free to be elsewise and includes other surface-processing methods in other embodiments. The surface-processing method includes mounting two external conductive layers 17 shown in FIG. 10 on each of the semiconductor packaging units 10. The two external conductive layers 17 respectively cover and electrically connect the two contact bulks 16 shown in FIG. 9. Since in the solder masking step, parts of the first bridge layer 141 and of the second bridge layer overlapping the lead frame 12 are exposed from the two insulation layers 15, the two external conductive layers 17 also respectively cover and electrically connect the first bridge layer 141 and the second bridge layer. The two external conductive layers 17 cover the two contact bulks 16, the first bridge layer 141, and the second bridge layer to prevent the two contact bulks 16, the first bridge layer 141, and the second bridge layer from oxidizing. This way, good soldering qualities and electrical conductivity are ensured for each of the semiconductor packaging units 10.

Figure 11:
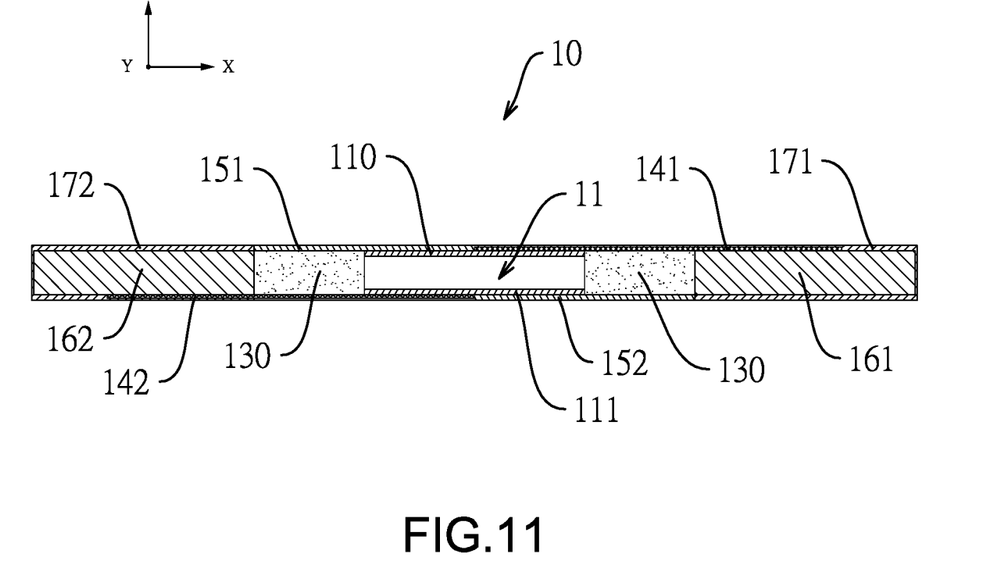
FIG. 11 is a cross-sectional perspective view of FIG. 10.

With reference to FIGS. 9 to 11, in conclusion to the above descriptions, the semiconductor packaging unit 10 of the present invention includes a semiconductor die 11, a mold 130, two contact bulks 16, a first bridge layer 141, a second bridge layer 142, two insulation layers 15, and/or additionally two external conductive layers 17. For ease of explaining, the two contact bulks 16 are respectively defined as a first contact bulk 161 and a second contact bulk 162, the two insulation layers 15 are respectively defined as a first insulation layer and a second insulation layer 152, and the two external conductive layers 17 are respectively defined as a first external conductive layer 171 and a second external conductive layer 172. The semiconductor die 11 includes a top electrode 110 and a bottom electrode 111.

Figure 12:
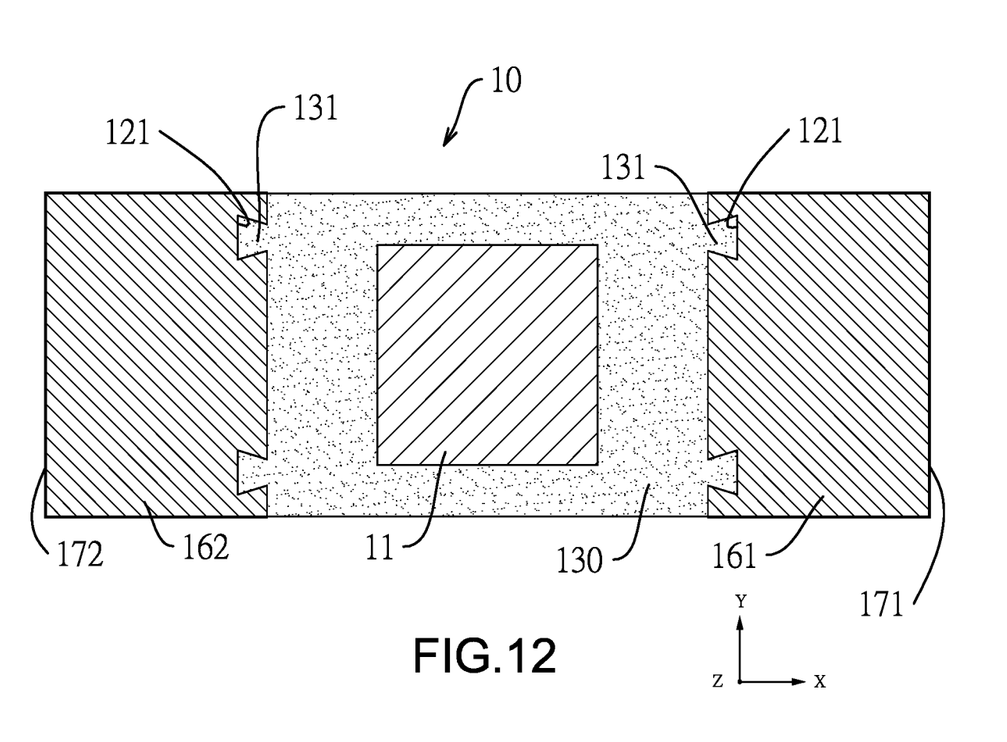
FIG. 12 is another cross-sectional perspective view of FIG. 10.

With reference to FIG. 12, the mold 130 covers a side surface of the semiconductor die 11. The top electrode 110 and the bottom electrode 111 of the semiconductor die 11 are exposed from the mold 130. The mold 130 includes two sides opposite to each other along a horizontal direction (the X-axis direction), and the semiconductor die 11 is positioned between the two sides. The first contact bulk 161 and the second contact bulk 162 are respectively mounted on the two sides of the mold 130. Dimensions of the first contact bulk 161 and dimensions of the second contact bulk 162 can be different. For example, dimensions of the first contact bulk 161 are greater than dimensions of the second contact bulk 162, allowing electric properties to be easily distinguished between the first contact bulk 161 and the second contact bulk 162, such as distinguishing which represents a positive polarity, a negative polarity, an anode, or a cathode, etc.

In FIG. 12, the second contact bulk 162 follows similar logic to the first contact bulk 161. The first contact bulk 161 includes at least one first contact area 121. At least one second contact area 131 is included on a side of the first contact bulk 161 connecting to the mold 130. The at least one second contact area 131 is in fact parts of the mold 130 filled in the at least one first contact area 121 (the grooves) in the molding step. In other words, the at least one second contact area 131 is a protruding part formed within the at least one first contact area 121 (the groove). This allows the at least one second contact area 131 to connect with the at least one first contact area 121, and as a result, ensuring a stable connection between the mold 130, the first contact bulk 161, and the second contact bulk 162.

With reference to FIGS. 9 to 11, the first bridge layer 141 connects the top electrode 110 of the semiconductor die 11 and the first contact bulk 161. The first bridge layer 141 connects the top electrode 110 of the semiconductor die 11, the top surface of the mold 130, and a top surface of the first contact bulk 161, allowing the top electrode 110 of the semiconductor die 11 to electrically connect the first contact bulk 161.

With reference to FIG. 11, the second bridge layer 142 connects the bottom electrode 111 of the semiconductor die 11 and the second contact bulk 162. The second contact bulk 162 connects the bottom electrode 111 of the semiconductor die 11, the bottom surface of the mold 130, and a bottom surface of the second contact bulk 162, allowing the bottom electrode 111 of the semiconductor die 11 to electrically connect the second contact bulk 162.

With reference to FIGS. 9 to 11, the first insulation layer 151 covers the first bridge layer 141, wherein the first insulation layer 151 covers an overlapping part of the first bridge layer 141 with the mold 130 and the top electrode 110 of the semiconductor die 11. The first insulation part 151 can also cover the top surface of the mold 130.

With reference to FIG. 11, the second insulation layer 152 covers the second bridge layer 142, wherein the second insulation layer 152 covers an overlapping part of the second bridge layer 142 with the mold 130 and the bottom electrode of the semiconductor die 11. The second insulation part 152 can also cover the bottom surface of the mold 130.

The first external conductive layer 171 covers and electrically connects the first contact bulk 161, wherein the first external conductive layer 171 covers surfaces of the first contact bulk 161 exposed from the first insulation layer 151, the second insulation layer 152, and the first bridge layer 141. The first external conductive layer 171 also covers an overlapping part between the first bridge layer 141 and the first contact bulk 161.

The second external conductive layer 172 covers and electrically connects the second contact bulk 162, wherein the second external conductive layer 172 covers surfaces of the second contact bulk 162 exposed from the first insulation layer 151, the second insulation layer 152, and the second bridge layer 142. The second external conductive layer 172 also covers an overlapping part between the second bridge layer 142 and the second contact bulk 162.

Dimensions of the first external conductive layer 171 and dimensions of the second external conductive layer 172 can be different. For example, dimensions of the first external conductive layer 171 are greater than dimensions of the second external conductive layer 172, allowing electric properties to be easily distinguished between the first external conductive layer 171 and the second external conductive layer 172, such as distinguishing which represents the positive polarity, the negative polarity, the anode, or the cathode, etc.

In conclusion, the present invention includes the following benefits:

1. In comparison with the conventional semiconductor packaging unit 60 shown in FIG. 19, the semiconductor packaging unit 10 of the present invention connects the semiconductor die 11 to the two contact bulks 16 with flatter and more layered structures such as the first bridge layer 141 and the second bridge layer 142, rather than using conventional method of wire bonding. For this reason, the semiconductor packaging unit 10 of the present invention is thinned down to be a thin semiconductor packaging unit, wherein the thin semiconductor packaging unit of the present invention has less thickness and less volume than the conventional semiconductor packaging unit 60 shown in FIG. 19.

2. In comparison with molds 56 of the conventional semiconductor packaging unit 60 shown in FIG. 19, the molds 130 of the present invention have less thickness and volume. By comparing FIG. 1 of the present invention to FIG. of the prior art, the PCB 20 in FIG. 1 requires less soldering surface area to mount the semiconductor packaging unit 10 of the present invention, and as a result, the present invention requires less space from the PCB 20, and so the PCB can be made smaller. Furthermore, when the semiconductor packaging unit of the present invention is in use, heat generated by the semiconductor die 11 can be faster conducted to a surface of the insulation layer 15 for more efficient heat dissipation.

3. The two external insulation layers 17 are made with metallic materials. By mounting the two external insulation layers 17 and by soldering the semiconductor packaging unit 10 on the PCB 20, the two external insulation layers 17 would be able to dissipate heat more efficiently, and surfaces of the two external conductive layers 17 would be able to ensure better solder filleting abilities, in other words, ensuring better soldering stability. Furthermore, since the present invention ensures better solder filleting abilities, less solder is needed for soldering. This lowers a cost for soldering, but also prevents strain from excessive stress cost by excessive soldering.

4. With reference to FIGS. 1 and 10, the semiconductor packaging unit 10 of the present invention has an external appearance of a passive component such as a resistor, an inductor, or a capacitor, and the semiconductor packaging unit 10 of the present invention is easily applicable to surface-mounted technology (SMT). By having the first contact bulk 161 and the second contact bulk 162 with different dimensions as shown in FIG. 9, or by having the first external conductive layer 171 and the second external conductive layer 172 with different dimensions as shown in FIG. 10, the semiconductor packaging unit 10 is able to connect to two pads 21 of the PCB 20 directly and straightforwardly by size-matching dimensions. The two pads 21 of the PCB 20 has different dimensions as shown in FIG. 1, and this difference in dimensions between the two pads 21 allows easy size-matching dimensions with the aforementioned corresponding parts of the semiconductor packaging unit 10. This way, electric symbols representing the positive polarity, the negative polarity, the anode, or the cathode may be omitted from printing on the semiconductor packaging unit 10.

5. The first contact bulk 161 and the second contact bulk 162 shown in FIG. 9 are exposed, and similarly, the first external conductive layer 171 and the second external conductive layer 172 shown in FIG. 10 are also exposed. As such, the semiconductor packaging unit 10 of the present invention can be rotated along the X-axis to any side surfaces of the semiconductor packaging unit 10 for mounting on the PCB 20. In other words, the semiconductor packaging unit 10 can be mounted on the two pads 21 of the PCB 20 from the top, from the bottom, or from the sides. Furthermore, the semiconductor packaging unit 10 of the present invention is able to replace the conventional semiconductor packaging unit 60 shown in FIG. 19, and the semiconductor packaging unit 10 is able to be directly applied to a conventional printed circuit board 70 shown in FIG. 20 without a need for re-designing or modifying layouts.

6. The present invention only requires one step—the grinding step, to remove unwanted contents away from the molding layer 13. However, the prior art requires multiple steps to remove unwanted contents such as an additional frame, a residue, and burrs. For this reason, the present invention is able to simplify the packaging method for the semiconductor packaging unit 10, increasing packaging efficiency of the semiconductor packaging unit 10, and decreasing packaging costs for the semiconductor packaging unit 10.

What is claimed is:

1. A thin semiconductor packaging unit, comprising:
a semiconductor die, having a top electrode and a bottom electrode;
a mold, covering a side surface of the semiconductor die, and exposing the top electrode and the bottom electrode; wherein the mold comprises two sides, and each of the sides comprises at least one first contact area;
two contact bulks, respectively mounted on the two sides of the mold; wherein each of the contact bulks comprises at least one second contact area, and the at least one second contact area is connected with the at least one first contact area;
a first bridge layer, connecting the top electrode of the semiconductor die to one of the contact bulks;
a second bride layer, connecting the bottom electrode of the semiconductor die to the other one of the contact bulks; and
two insulation layers, respectively covering the first bridge layer and the second bridge layer.

2. The thin semiconductor packaging unit as claimed in claim 1, wherein
the at least one first contact area is a groove, and the at least one second contact area is a part formed protruding in the at least one first contact area.

3. The thin semiconductor packaging unit as claimed in claim 2, wherein
a width of the groove and of the part formed protruding in the at least one first contact area decreases in a direction towards the semiconductor die.

4. The thin semiconductor packaging unit as claimed in claim 1, wherein
the two contact bulks respectively have different dimensions.

5. The thin semiconductor packaging unit as claimed in claim 1, wherein:
the two contact bulks are respectively defined as a first contact bulk and a second contact bulk, and the two insulation layers are respectively defined as a first insulation layer and a second insulation layer;
the first bridge layer connects the top electrode of the semiconductor die, a top surface of the mold, and a top surface of the first contact bulk;
the second bridge layer connects the bottom electrode of the semiconductor die, a bottom surface of the mold, and a bottom surface of the second contact bulk;
the first insulation layer covers an overlapping part of the first bridge layer with the mold and the top electrode of the semiconductor die; and
the second insulation layer covers an overlapping part of the second bridge layer with the mold and the bottom electrode of the semiconductor die.

6. The thin semiconductor packaging unit as claimed in claim 2, wherein:

the two contact bulks are respectively defined as a first contact bulk and a second contact bulk, and the two insulation layers are respectively defined as a first insulation layer and a second insulation layer;
the first bridge layer connects the top electrode of the semiconductor die, a top surface of the mold, and a top surface of the first contact bulk;
the second bridge layer connects the bottom electrode of the semiconductor die, a bottom surface of the mold, and a bottom surface of the second contact bulk;
the first insulation layer covers an overlapping part of the first bridge layer with the mold and the top electrode of the semiconductor die; and
the second insulation layer covers an overlapping part of the second bridge layer with the mold and the bottom electrode of the semiconductor die.

7. The thin semiconductor packaging unit as claimed in claim 3, wherein:
the two contact bulks are respectively defined as a first contact bulk and a second contact bulk, and the two insulation layers are respectively defined as a first insulation layer and a second insulation layer;
the first bridge layer connects the top electrode of the semiconductor die, a top surface of the mold, and a top surface of the first contact bulk;
the second bridge layer connects the bottom electrode of the semiconductor die, a bottom surface of the mold, and a bottom surface of the second contact bulk;
the first insulation layer covers an overlapping part of the first bridge layer with the mold and the top electrode of the semiconductor die; and
the second insulation layer covers an overlapping part of the second bridge layer with the mold and the bottom electrode of the semiconductor die.

8. The thin semiconductor packaging unit as claimed in claim 4, wherein:
the two contact bulks are respectively defined as a first contact bulk and a second contact bulk, and the two insulation layers are respectively defined as a first insulation layer and a second insulation layer;
the first bridge layer connects the top electrode of the semiconductor die, a top surface of the mold, and a top surface of the first contact bulk;
the second bridge layer connects the bottom electrode of the semiconductor die, a bottom surface of the mold, and a bottom surface of the second contact bulk;
the first insulation layer covers an overlapping part of the first bridge layer with the mold and the top electrode of the semiconductor die; and
the second insulation layer covers an overlapping part of the second bridge layer with the mold and the bottom electrode of the semiconductor die.

9. The thin semiconductor packaging unit as claimed in claim 1, further comprising:
two external conductive layers; wherein the two external conductive layers respectively cover and electrically connect the two contact bulks, and the two external conductive layers respectively have different dimensions.

10. The thin semiconductor packaging unit as claimed in claim 2, further comprising:
two external conductive layers; wherein the two external conductive layers respectively cover and electrically connect the two contact bulks, and the two external conductive layers respectively have different dimensions.

11. The thin semiconductor packaging unit as claimed in claim 3, further comprising:
- two external conductive layers; wherein the two external conductive layers respectively cover and electrically connect the two contact bulks, and the two external conductive layers respectively have different dimensions.

12. The thin semiconductor packaging unit as claimed in claim 4, further comprising:
- two external conductive layers; wherein the two external conductive layers respectively cover and electrically connect the two contact bulks, and the two external conductive layers respectively have different dimensions.

13. The thin semiconductor packaging unit as claimed in claim 5, further comprising:
- a first external conductive layer, covering surfaces of the first contact bulk exposed from the first insulation layer, the second insulation layer, the first bridge layer, and an overlapping part between the first bridge layer and the first contact bulk;
- a second external conductive layer, covering surfaces of the second contact bulk exposed from the first insulation layer, the second insulation layer, the second bridge layer, and an overlapping part between the second bridge layer and the second contact bulk;
- wherein the first external conductive layer and the second external conductive layer respectively have different dimensions.

14. The thin semiconductor packaging unit as claimed in claim 6, further comprising:
- a first external conductive layer, covering surfaces of the first contact bulk exposed from the first insulation layer, the second insulation layer, the first bridge layer, and an overlapping part between the first bridge layer and the first contact bulk;
- a second external conductive layer, covering surfaces of the second contact bulk exposed from the first insulation layer, the second insulation layer, the second bridge layer, and an overlapping part between the second bridge layer and the second contact bulk;
- wherein the first external conductive layer and the second external conductive layer respectively have different dimensions.

15. The thin semiconductor packaging unit as claimed in claim 7, further comprising:
- a first external conductive layer, covering surfaces of the first contact bulk exposed from the first insulation layer, the second insulation layer, the first bridge layer, and an overlapping part between the first bridge layer and the first contact bulk;
- a second external conductive layer, covering surfaces of the second contact bulk exposed from the first insulation layer, the second insulation layer, the second bridge layer, and an overlapping part between the second bridge layer and the second contact bulk;
- wherein the first external conductive layer and the second external conductive layer respectively have different dimensions.

16. The thin semiconductor packaging unit as claimed in claim 8, further comprising:
- a first external conductive layer, covering surfaces of the first contact bulk exposed from the first insulation layer, the second insulation layer, the first bridge layer, and an overlapping part between the first bridge layer and the first contact bulk;
- a second external conductive layer, covering surfaces of the second contact bulk exposed from the first insulation layer, the second insulation layer, the second bridge layer, and an overlapping part between the second bridge layer and the second contact bulk;
- wherein the first external conductive layer and the second external conductive layer respectively have different dimensions.

* * * * *